United States Patent
Okada et al.

(10) Patent No.: US 6,756,111 B1
(45) Date of Patent: Jun. 29, 2004

(54) COATED HARD ALLOY

(75) Inventors: Yoshio Okada, Itami (JP); Hideki Moriguchi, Itami (JP); Akihiko Ikegaya, Itami (JP)

(73) Assignee: Sumitomo Electric Industries, Ltd., Osaka (JP)

(*) Notice: Subject to any disclaimer, the term of this patent is extended or adjusted under 35 U.S.C. 154(b) by 60 days.

(21) Appl. No.: 09/980,820

(22) PCT Filed: Jun. 15, 2000

(86) PCT No.: PCT/JP00/03927
§ 371 (c)(1),
(2), (4) Date: Dec. 7, 2001

(87) PCT Pub. No.: WO00/79022
PCT Pub. Date: Dec. 28, 2000

(30) Foreign Application Priority Data

Jun. 21, 1999 (JP) .......................................... 11-174737

(51) Int. Cl.$^7$ ................................................. B32B 9/00
(52) U.S. Cl. ........................ 428/216; 428/142; 428/174; 428/336; 428/472; 428/697; 428/698; 428/701; 428/702
(58) Field of Search ................................. 428/697, 698, 428/701, 702, 216, 336, 472, 142, 174

(56) References Cited

U.S. PATENT DOCUMENTS

| | | | | |
|---|---|---|---|---|
| 5,766,782 A | * | 6/1998 | Ljungberg | |
| 5,863,640 A | * | 1/1999 | Ljungberg et al. | |
| 6,293,739 B1 | * | 9/2001 | Uchino et al. | |
| 6,333,098 B1 | * | 12/2001 | Olsson et al. | |
| 6,333,103 B1 | * | 12/2001 | Ishii et al. | |

FOREIGN PATENT DOCUMENTS

| | | |
|---|---|---|
| EP | 0503822 | 9/1992 |
| EP | 0603144 | 6/1994 |
| EP | 0732423 | 9/1996 |
| JP | 61-195975 | 8/1986 |
| JP | 05-057507 | 3/1993 |
| JP | 05-269606 | * 10/1993 |
| JP | 08-132130 | * 5/1996 |
| JP | 08-158052 | 6/1996 |
| JP | 11-124672 | 5/1999 |

* cited by examiner

*Primary Examiner*—Archene Turner
(74) *Attorney, Agent, or Firm*—McDermott, Will & Emery

(57) ABSTRACT

A coated hard metal which has high resistance against wear, chipping, welding, and flaking is offered. The coated hard metal is provided with an inner layer, intermediate layer, and outer layer on the surface of the hard metal. The inner layer includes a layer comprising at least one member selected from the group consisting of (a) the carbides, nitrides, borides, and oxides of the elements belonging to the IVa, Va, and VIa groups in the periodic table and (b) the solid solutions of these. The intermediate layer includes a layer comprising at least one member selected from the group consisting of aluminum oxide, zirconium oxide, and their solid solution. The outer layer includes a layer of titanium carbonitride having a columnar structure. In a cross section showing the structure of the coated hard metal, the relation between "Amax," which signifies the maximum roughness at the outer face of the intermediate layer, and "Bmax," which signifies the maximum roughness at the outer face of the layer carbonitride having a columnar structure in the outer layer, satisfies equation 1.

$$(Bmax f Amax) < 1 \qquad \text{equation 1,}$$

where 0.5 $\mu$m < Amax < 4.5 $\mu$m, and 0.5 $\mu$m $\leq$ Bmax $\leq$ 4.5 $\mu$m.

11 Claims, 2 Drawing Sheets

COATED HARD ALLOY

FIELD OF THE INVENTION

The present invention relates to a coated hard metal, particularly one that is most suitable for cutting tools, that has high resistance against wear, chipping, welding, and flaking, and that can maintain the superior properties over an extended period of time.

DESCRIPTION OF THE BACKGROUND ART

Tools made of coated hard metal have become commercially practical and have come into wide use. The tool has a hard metal surface which is coated to improve the cutting property. The coating is composed of one or more layers of titanium carbide, titanium nitride, titanium carbonitride, or aluminum oxide, for example. The coating is deposited by chemical vapor deposition or physical vapor deposition.

Being non-oxide layers, such titanium-based coatings are useful in improving resistance to wear and to chipping. Oxide layers such as an aluminum oxide layer and a zirconium oxide layer are considered to be suitable for use in a temperature range exceeding 700° C. (high-speed cutting range) at the corner of a cutting tool, because they are excellent in chemical stability and resistance to heat.

Cutting work has improved, in recent years, in terms of speed and efficiency prompted by advancements in machine tools and in response to manufacturing-cost reduction demands and productivity improvement requirements. From the viewpoint of environmental protection, dry machining has been in urgent demand in order to reduce the consumption of cutting oil. In response to such a movement in the market, the use of the corner portion of a cutting tool at high-temperature range has been increasing.

In order to meet the market requirement and to lengthen the lifetime of a tool, an oxide layer excellent in chemical stability at high temperatures and in resistance to heat, such as an aluminum oxide layer and a zirconium oxide layer, has been used to coat the surface of a cutting tool, and the thickness of the oxide layer has been increased.

However, when the thickness of the oxide layer (especially the aluminum oxide layer) is increased to 1.5 $\mu$m or more, the crystal grains of the oxide layer constituting the coating become coarsened, developing an unevenness on the surface of the tool in response to the grain size. This unevenness allows the chips of the work material to apply local stresses to the surface of the tool, accelerating the wear and decreasing the toughness. In addition, the chip welds itself to the uneven portion. The welded portion in turn becomes a starting point of stress application, causing flaking of the layer or chipping. As a result, the lifetime of the cutting tool is shortened.

In order to resolve this problem, published Japanese patent application Tokukouhei 5-49750 offers a method for preventing the coarsening of the crystal grains by dividing the aluminum oxide layer into multiple layers. This method undoubtedly decreases the grain size of the aluminum oxide. On the other hand, this method increases the number of interfaces between an aluminum oxide layer and an layer made of another substance, causing flaking to occur easily at the interface. The flaking develops rapid damage, decreasing the lifetime of the tool.

Another published Japanese patent application, Tokukouhei 5-57507, lengthens the lifetime of a tool by removing the unevenness of the face of the oxide layer only at the cutting edge of the tool by polishing. Although this method can increase the lifetime of the cutting edge, the aforementioned face unevenness of the oxide layer remains as a concavity on the cutting face that cannot be processed by polishing. This remaining face unevenness accelerates crater wear and other types of wear, decreasing the lifetime of the tool.

Yet another published Japanese patent application, Tokukouhei 11-124672, uses an $\alpha$-type aluminum oxide for an outer layer as a high-strength layer and specifies the oriented texture. This method, however, produces on the surface of the tool an unevenness corresponding to the size of the crystal grains of the aluminum oxide in the outer layer, causing a decrease in the lifetime of the tool.

Yet another published Japanese patent application, Tokukouhei 8-158052, discloses a similar layer structure to that of the present invention. However, in Tokukouhei 8-158052, the face roughness of an intermediate layer is transferred to an outer layer without improvement. The present inventors have continued to study a further increase in the lifetime of a tool, especially in the case of high-speed cutting and dry cutting, and completed the present invention.

In view of the foregoing circumstances, the main object of the present invention is to offer a coated hard-metal cutting tool that has an outer layer in which the face unevenness specific to an oxide layer is reduced, that has improved resistance to wear, to chipping, to welding, and to flaking throughout the tool, and that can maintain the superior properties for a prolonged period of time.

DETAILED DESCRIPTION OF THE INVENTION

The present invention offers a coated hard metal having a coating on its surface. The coating comprises an inner layer, intermediate layer, and outer layer in that order from the hard-metal side. The individual layers have the following constitutions and the specified face roughness.

The inner layer includes a layer comprising at least one member selected from the group consisting of (a) the carbides, nitrides, borides, and oxides of the elements belonging to the IVa, Va, and VIa groups in the periodic table and (b) the solid solutions of these.

The intermediate layer includes a layer comprising at least one member selected from the group consisting of aluminum oxide, zirconium oxide, and their solid solution.

The outer layer includes a layer of titanium carbonitride having a columnar structure and a layer comprising at least one member selected from the group consisting of (a) the carbides, nitrides, borides, and oxides of the elements belonging to the IVa, Va, and VIa groups in the periodic table, (b) the solid solutions of these, and (c) aluminum oxide.

As for the face roughness obtained in a cross section showing the structure of the coated hard metal, the relation between "Amax," which signifies the maximum roughness at the outer face (the interface) of the intermediate layer, and "Bmax," which signifies the maximum roughness at the outer face (the interface) of the layer of titanium carbonitride having a columnar structure in the outer layer, satisfies equation 1. It is more desirable that the relation satisfy equation 2.

$$(Bmax/Amax) < 1 \quad \text{equation 1,}$$

where 0.5 $\mu$m < Amax < 4.5 $\mu$m, and 0.5 $\mu$m $\leq$ Bmax 4.5 $\mu$m.

$$(Bmax/Amax) < 0.8 \quad \text{equation 2.}$$

The face roughness is measured by the following method: A cross section perpendicular to the flank of the tool is mirror-polished. A photograph such as shown in FIG. 1 is taken under an optical microscope at 1,500 power. The unit evaluation length in a measuring area is 0.02 mm. The difference between the maximum peak height and the minimum peak height in the unit evaluation length is defined as the maximum roughness in the present invention. The maximum roughness at the outer face of the intermediate layer and the maximum roughness at the outer face of the layer of TiCN having a columnar structure in the outer layer are measured in five different fields of vision to obtain their respective average values. The average value is used as the value of the maximum roughness to calculate equation 1. Since the conventional probe method is unable to measure the face roughness at an interface, the above-described method is employed in the present invention.

When titanium carbonitride, which has high resistance to wear, is used as the outer layer, the temperature of the entire tool becomes high when the tool is used for cutting at a high-temperature range as in high-speed cutting, because titanium carbonitride has high thermal conductivity. As a result, the hard metal as the base material deforms plastically, raising the cutting resistance and thereby leading to fracture. In order to solve this problem, it is possible to provide a thick intermediate layer made of aluminum oxide or zirconium oxide, both of which have low thermal conductivity, between the hard metal and the titanium carbonitride. However, the foregoing oxide and titanium carbonitride have low strength for mutual bonding. Consequently, if an ordinary coating method is used, it will flake off during use. A thick intermediate layer has a large magnitude in face roughness and this large magnitude tends to be transferred to the outer layer, causing the coated hard metal to have an outer layer with large face roughness.

The present inventors studied a means to solve this problem and finally completed the present invention. In the present invention, in order to increase the strength of bonding between the intermediate layer and outer layer, the face roughness of the intermediate layer is increased. The area for bonding with the outer layer therefore is increased and the anchor effect is enhanced. In addition, in order to reduce the face roughness of the outer layer, titanium carbonitride having a columnar structure with a specific crystal orientation is used in the outer layer.

The present inventors found that when the aluminum oxide in the intermediate layer is cooled after the formation, cracks occur in the intermediate layer in a direction perpendicular to the layer. The cracks reduce the tensile stress in the intermediate layer and allow TiN, for example, in the outer layer to penetrate into the cracks, so a strong anchor effect can be obtained.

As can be seen from FIG. 1, the maximum roughness is large at the interface between the aluminum oxide in the intermediate layer and the titanium carbonitride in the outer layer. On the other hand, the maximum roughness is small at the surface of the outer layer. This phenomenon is expressed in equations 1 and 2. The titanium carbonitride layer having such a specific property cannot be obtained by ordinary methods. This can be achieved only when the use of an organic compound having a CN base accelerates the growing rate of crystals, producing a specific crystal orientation.

As for the inner layer, various compounds can be used that have a higher bonding strength with the oxide constituting the intermediate layer than the hard metal has. This practice is not uncommon.

The above statement can be summarized as follows:

(a) First, the surface of a hard metal is coated with an inner layer. Second, the inner layer is coated with an intermediate layer composed of an oxide layer that is excellent in chemical stability and resistance to heat and that is coarse in grain size. Third, the intermediate layer is coated with an outer layer including a layer of titanium carbonitride having a columnar structure (a crystal structure having a columnar construction) in such a manner that the face unevenness of the intermediate layer can be absorbed by the outer layer. FIG. 2 shows the columnar structure in the outer layer. This photograph shows a fractured section of a coated hard metal.

(b) Face unevenness is intentionally formed on the surface of the oxide layer in the intermediate layer so that the bonding strength between the aluminum oxide in the intermediate layer and the outer layer is increased. The conventional method was unable to provide high bonding strength between the two layers.

(c) A reduction in the face unevenness of the outer layer can improve the resistance to wear, to chipping, and to welding of the entire layer, maintaining the excellent properties for a long period of time.

The individual layers have the following limitations in thickness: It is desirable that the inner layer have a thickness of 0.1 to 10 $\mu$m. If more than 10 $\mu$m, the strength decreases. If less than 0.1 $\mu$m, no effect can be expected. It is desirable that the intermediate layer have a thickness of 1.5 to 20 $\mu$m. If less than 1.5 $\mu$m, the thermal conduction cannot be suppressed. If more than 20 $\mu$m, the strength tends to decrease, shortening the lifetime of the tool. It is more desirable that the intermediate layer have a thickness of 5 to 15 $\mu$m. It is desirable that the outer layer have a thickness of 2 to 30 $\mu$m. If less than 2 $\mu$m, the face unevenness of the intermediate layer cannot be decreased effectively. If more than 30 $\mu$m, the face unevenness of the outer layer itself becomes larger than that of the intermediate layer. It is more desirable that the outer layer have a thickness of 5 to 20 $\mu$m.

In order to decrease the face unevenness of the intermediate layer, it is desirable that the layer of titanium carbonitride having a columnar structure in the outer layer have the largest value in the oriented texture coefficient TC at any one of the (220), (311), (331), and (422) planes and that the largest value be not less than 1.3 and not more than 3.5. It is more desirable that the TCs at the (311) and (422) planes be concurrently not less than 1.3 and not more than 3.5. In the above statement, the oriented texture coefficient TC is defined in equation 3 below.

$$TC(hkl) = \frac{I(hkl)}{Io(hkl)} \left\{ \frac{1}{8} \sum_{x,y,z} \frac{I(h_x k_y l_z)}{Io(h_x k_y l_z)} \right\}^{-1} \qquad \text{equation 3}$$

where I(hkl) and I($h_x k_y l_z$): the measured diffraction intensity at the (hkl) and ($h_x k_y l_z$) planes, respectively, $I_0$(hkl) and $I_0$($h_x k_y l_z$): the average value of the powder diffraction intensities of TiC and TiN at the (hkl) and ($h_x k_y l_z$) planes, respectively, in accordance with the ASTM Standard, and (hkl) and ($h_x k_y l_z$): eight planes of (111), (200), (220), (311), (331), (420), (422), and (511), respectively.

The oriented texture coefficient TC of the layer of titanium carbonitride having a columnar structure is obtained from the diffraction peak of X-ray diffraction. In this case, the diffraction peak of the (311) plane of TiCN overlaps that of the (111) plane of WC in the base material. Consequently, the data is corrected by the following method: It is known that the peak intensity of the (111) plane of WC is 25% of that of the (101) plane of WC, the highest peak in WC. (The peak of the (101) plane of WC is shown as (A) in FIG. 3.) Accordingly, the true peak intensity of the (311) plane of TiCN is obtained by subtracting the value derived from a multiplication of the peak intensity of the (101) plane of WC by 0.25 (the derived value is equal to the peak intensity of the (111) plane of WC) from the apparent peak intensity of the (311) plane of TiCN. FIG. 3 shows a chart of the diffraction peaks obtained in Tool No. 10 in the examples.

When the oriented texture coefficient of the layer of titanium carbonitride having a columnar structure is specified to fall within the foregoing limits, the face roughness of the oxide layer in the intermediate layer can be decreased. As a result, a coated hard metal satisfying the relation expressed in equation 1 can easily be obtained, improving resistance to wear, to chipping, and to welding and performing with excellent properties.

The titanium carbonitride layer can be formed, for example, by using $TiCl_4$, organic carbonitride, hydrogen gas, and nitrogen gas for a process at a temperature of 700 to 1,000° C. and a pressure of not more than 667 hPa. In particular, when $CH_3CN$ is used as a source of carbon and nitrogen, producing columnar crystal grains of the TiCN is facilitated. In this case, a desirable process is as follows: The forming process is divided into two processes: the first half and second half. In the first half, the ratio "$(TiCl_4+CH_3CN)$/total-gas-volume" is controlled to be smaller than that of the second half, and the ratio "$N_2$/total-gas-volume" is controlled to be two or more times that of the second half. It is desirable that the titanium carbonitride layer have a thickness less than 10 $\mu$m.

It is desirable that the intermediate layer be composed practically of α-type aluminum oxide in order to increase the mechanical strength. It is also desirable that the α-type aluminum oxide have an oriented texture coefficient TCa (012) more than 1.3. In this case, the oriented texture coefficient TCa is defined in equation 4 below.

$$TCa(hkl) = \left\{ \frac{1}{6} \sum_{x,y,z} \frac{I(k_x k_y l_z)}{I_o(h_x k_y l_z)} \right\}^{-1} \qquad \text{equation 4}$$

where I(hkl) and $I(h_x k_y l_z)$: the measured diffraction intensity at the (hkl) and $(h_x k_y l_z)$ planes, respectively, $I_0$(hkl) and $I_0(h_x k_{y/z})$: the powder diffraction intensity of the α-type crystal-structure alumna at the (hkl) and $(h_x k_{y/z})$ planes, respectively, in accordance with the ASTM Standard, and (hkl) and $(h_x k_{y/z})$: six planes of (012), (104), (110), (113), (024), and (116), respectively.

In FIG. 3, diffraction peaks of aluminum oxide are hard to recognize. However, when the outer layer is removed, they appear clearly.

It is also desirable that TCa(104) and TCa(116) concurrently exceed 1.3. Such a specification of the oriented texture coefficient can produce the following effects, improving the resistance to flaking of the tool:

(a) Improvement in the mechanical strength of the oxide layer in the intermediate layer;

(b) Acceleration of the coarsening of the crystal grains of the intermediate layer; and (c) Improvement in the strength of the mechanical bonding between the intermediate layer and the outer layer.

These effects enable the tool to perform the excellent properties of chemical stability at high temperatures and the resistance to heat, thereby extending the lifetime of the tool.

The control of the oriented texture coefficient of the aluminum oxide, for example, can be carried out in the following manner: First, individual layers up to the layer immediately below the aluminum oxide are formed. Second, the coating is exposed to a $CO_2$ atmosphere at a pressure of 0.4 to 0.8 hPa to slightly oxidize part of the surface of the coating. Third, the aluminum oxide layer is formed at 1,000 to 1,200° C., desirably at 1,050 to 1,150° C., on the surface of the coating. Through this process, an α-type aluminum oxide layer is formed without regard to the forming temperature of the aluminum oxide layer. In this process, the selection of the oxidizing condition for the surface of the layer immediately below the aluminum oxide layer enables the control of the oriented texture coefficient of the aluminum oxide. The oriented texture coefficient also can be controlled by changing the thickness of the aluminum oxide layer under the same oxidizing condition.

In addition to the above-described specification on the constitution of the individual layers, the lifetime of the tool can be further extended when the coating is polished to further decrease the surface roughness so that the surface roughness "Cmax" of the outermost surface of the coating satisfies equation 5. Even when this surface improvement is applied only to the cutting edge, the lifetime of the tool can be further extended.

$$Cmax|Bmax<0.5 \qquad \text{equation 5.}$$

It is desirable that as the base material the hard metal be made of a cemented carbide that comprises (a) a hard phase comprising tungsten carbide as the main constituent and at least one member selected from the group consisting of the carbides, nitrides, and carbonitrides of the metals belonging to the IVa, V a, and VIa groups in the periodic table and (b) a binder phase comprising at least one member of the metals belonging to the iron group.

In addition to the foregoing cemented carbide, a thermet alloy that comprises (a) a hard phase comprising titanium carbonitride as the main constituent and at least one member selected from the group consisting of (a1) the carbides, nitrides, and carbonitrides of the metals belonging to the IVa, Va, and VIa groups in the periodic table and (a2) the solid solutions of these and (b) a binder phase comprising at least one member of the metals belonging to the iron group may be used as the hard metal without any problem.

These hard metals can perform a property in which the resistance to wear and the resistance to chipping are particularly well balanced, thus extending the lifetime of the tool.

In the case that the hard metal having tungsten carbide as the main constituent is used as the base material, when the hard metal has at the surface region a layer in which the hard phase except tungsten carbide is reduced or removed (a hard-phase-reduced layer) and when the layer is controlled to have a thickness of 50 $\mu$m or less, the resistance to chipping can be further increased.

If the thickness of the hard-phase-reduced layer exceeds 50 $\mu$m, the surface region of the base material tends to deform plastically or elastically during the cutting work. The hard-phase-reduced layer can be formed either by the well-known method using a nitrogen-containing hard-phase material or by another method in which a nitrogen-added atmosphere is provided for the temperature-rising period in the sintering process. After the appearance of a liquid phase in the hard phase, the atmosphere is changed to a denitrified and decarburized atmosphere.

SIMPLE EXPLANATION OF THE DRAWINGS

BEST MODE FOR CARRYING OUT THE INVENTION

The embodiment of the present invention is explained in detail by the examples below.

EMBODIMENT 1

A cemented-carbide tool (type: CNMG120408) composed of 92% WC, 2% TiC, and 6% Co by weight was prepared as a hard-metal base material. The base material was placed in a CVD apparatus. The apparatus was evacuated and heated to a temperature of 900° C. A mixed gas of 3% $TiCl_4$, 20% nitrogen, and hydrogen as the remainder by volume was introduced into the apparatus to form a TiN layer, 3 $\mu$m in thickness, on the base material. Next, a mixed gas of 1.5% $AlCl_4$, 0.2% $H_2S$, 4% $CO_2$, and hydrogen as the remainder by volume was introduced into the CVD apparatus heated at 1,000° C. to form an aluminum oxide layer as an intermediate layer having a thickness of 5 $\mu$m.

Direct formation of a titanium carbonitride layer on the intermediate layer tends to facilitate flaking. To avoid this tendency, a titanium nitride layer, 0.5 $\mu$m in thickness, was first formed by introducing into the CVD apparatus a mixed gas of 1.5% $TiCl_4$, 20% $N_2$, and hydrogen as the remainder by volume at 950° C. On this layer, a 6-$\mu$m-thick layer of titanium carbonitride having a columnar structure was formed. The layer was formed by treating a mixed gas of 2.5% $TiCl_4$, 0.5% acetonitrile, 25% $N_2$, and hydrogen as the remainder by volume at a pressure of 70 hPa and a temperature of 900° C. Yet, a 1-$\mu$m-thick TiN layer was formed on this layer under the same condition as in the case of the inner layer. In the present invention, it is desirable that the type of layer be changed by evacuating the CVD apparatus to eliminate the influence of the gas used in the previous stage. Once exposed to the atmosphere, the surface layer will adsorb oxygen and other gases in the atmosphere, and a desirable result cannot be obtained. The inner layer, intermediate layer, and outer layer therefore, were formed without interruption.

Figure 2:
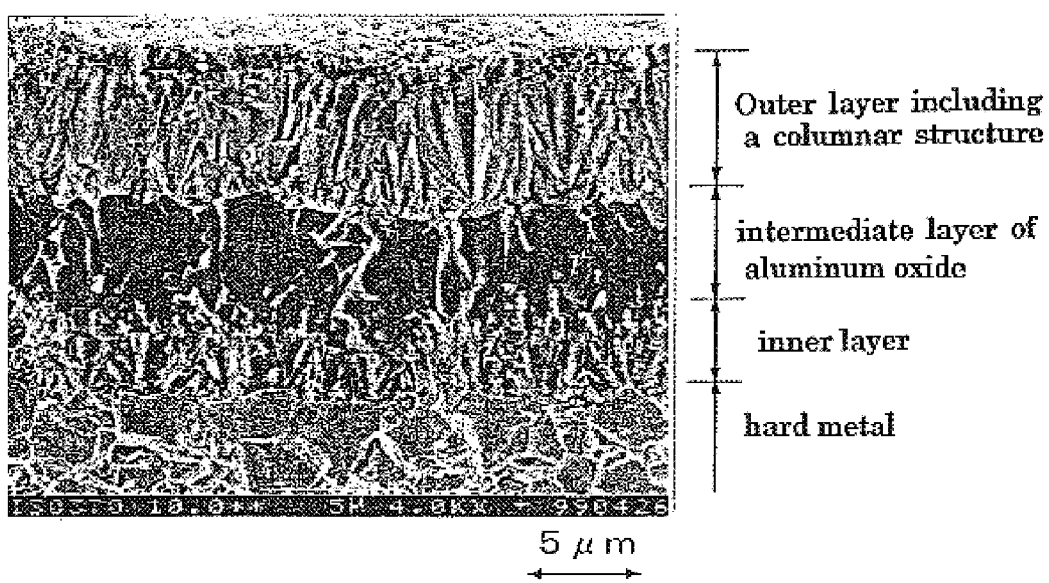
FIG. 2 is a micrograph showing a fractured section of the coated hard metal of the present invention.
Figure 3:
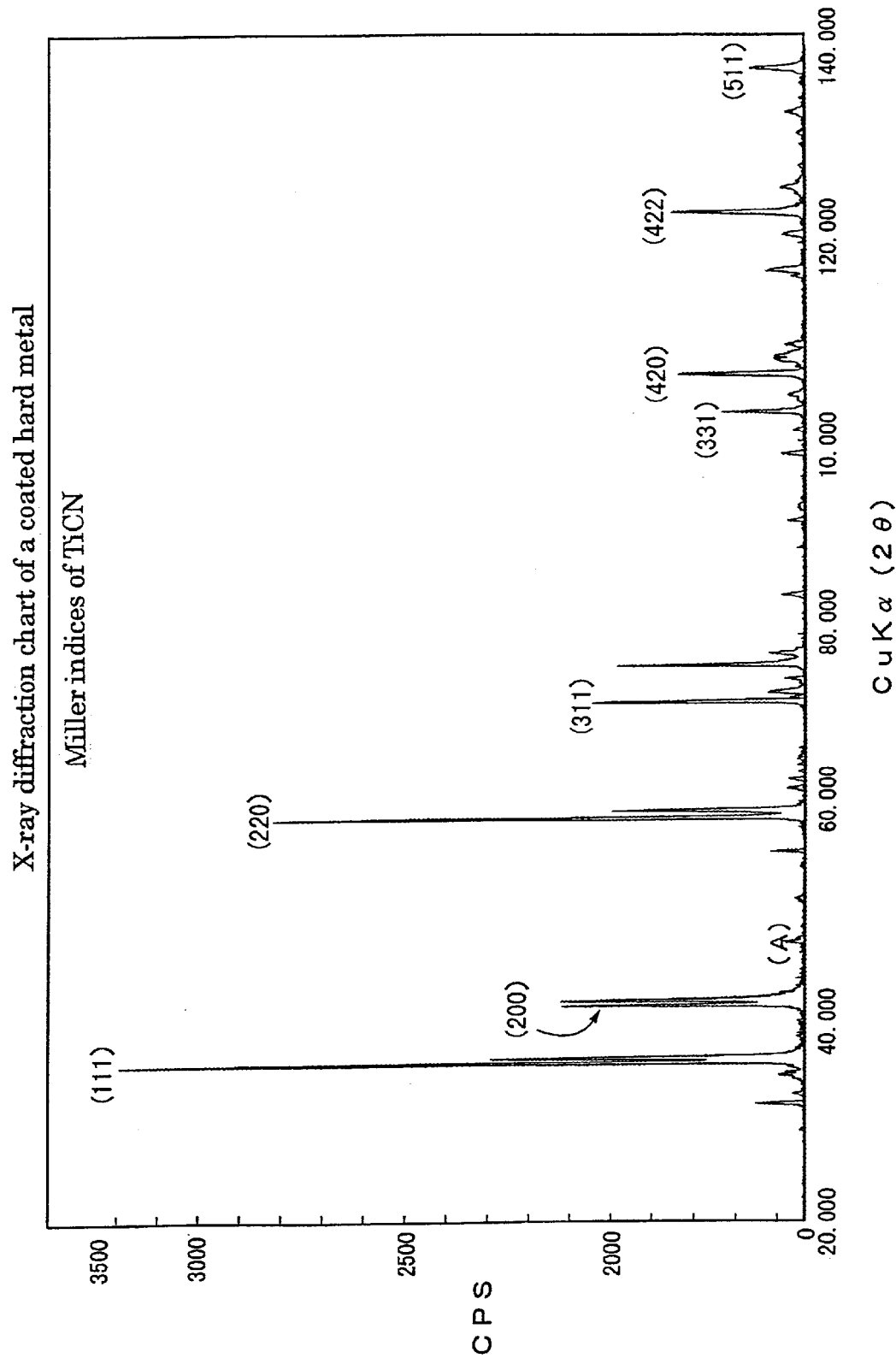
FIG. 3 is an X-ray diffraction chart of the coated hard metal of the present invention.

A coated hard metal thus obtained was fractured, and the structure at the fractured section is shown in FIG. 2. A layer including a columnar structure can be seen in the outer layer. The sample was cut and polished to measure the maximum roughness at the outer face of the specified layers. The measured results showed that Amax was 2 $\mu$m and Bmax was 1.5 $\mu$m.

EMBODIMENT 2

A cemented-carbide tool (type: WNMG120408), composed of 85% WC, 5% TiCN, and 10% Co by weight, having a hard-phase-reduced layer at the surface region was prepared as a hard-metal base material. The base material was placed in a CVD apparatus. The apparatus was evacuated and heated to a temperature of 1,050° C. A mixed gas of 2.5% $ZrCl_4$, 25% nitrogen, and hydrogen as the remainder by volume was introduced into the apparatus to form a ZrN layer, 0.5 $\mu$m in thickness, on the base material. Next, a mixed gas of 1% $AlCl_4$, 0.5% $ZrCl_4$, 0.2% $H_2S$, 4% CO, and hydrogen as the remainder by volume was introduced into the CVD apparatus heated at 1,000° C. to form an intermediate layer, made of a solid solution of aluminum oxide and zirconium oxide, having a thickness of 10 $\mu$m.

Direct formation of a titanium carbonitride layer on the intermediate layer tends to facilitate flaking. To avoid this tendency, a zirconium carbide layer, 1.5 $\mu$m in thickness, was first formed by introducing a mixed gas of 1.5% $ZrCl_4$, 3.5% $CH_4$, and hydrogen as the remainder by volume into a layer-forming chamber at 1,100° C. On this layer, a 15-$\mu$m-thick layer of titanium carbonitride having a columnar structure was formed. The layer was formed by treating a mixed gas of 2.5% $TiCl_4$, 0.5% tolunitrile, 25% $N_2$, and hydrogen as the remainder by volume at a pressure of 150 hPa and a temperature of 850° C.

The obtained coated hard metal had an outer layer having a columnar structure of titanium carbonitride. The surface of the outer layer had a maximum roughness, Bmax, of 1.5 $\mu$m; the outer face of the intermediate layer had a maximum roughness, Amax, of 2.2 $\mu$m. In addition to this tool, other tools in which the outer layer was coated with VN or CrN were also produced. The obtained results were similar to the result described above.

EMBODIMENT 3

As a material for a hard-metal base material, a powder for a cemented carbide composed of 84% WC, 4% TiC, 2% ZrC, 2% NbC, and 8% Co by weight was pressed. The pressed body was sintered in a vacuum at a temperature of 1,400° C. for one hour. The sintered body was subjected to surface polishing and cutting-edge treatment. Thus, a cemented-carbide base material consisting mainly of tungsten carbide and having a shape of ISO CNMG120408 was prepared. On the surface of this base material, a hard coating was formed by using the CVD method.

Table I shows typical manufacturing conditions for the coatings used in the present invention. In the examples below, the layers were formed by controlling only the coating time under the conditions shown in Table I unless otherwise specifically expressed.

TABLE I

| Sample No. | Composition of hard coating | Composition of reaction gas (vol. %) | Pressure (hPa) | Temperature (° C.) |
|---|---|---|---|---|
| 1 | TiN | $TiCl_4$: 2%; $N_2$: 25%; $H_2$: Remainder | 133 | 950 |
| 2 | TiCN | $TiCl_4$: 2%; $CH_4$: 4%; $N_2$: 20%; $H_2$: Remainder | 200 | 950 |
| 3 | TiCN having columnar structure | $TiCl_4$: 2%; $CH_3CN$: 0.6%; $N_2$: 20%; $H_2$: Remainder | 67–200 | 800–950 |
| 4 | TiC | $TiCl_4$: 2%; $CH_4$: 5%; $H_2$: Remainder | 133 | 1,050 |
| 5 | TiBN | $TiCl_4$: 2%; $BCl_3$: 5%; $N_2$: 5%; $H_2$: Remainder | 133 | 950 |
| 6 | TiCNO | $TiCl_4$: 2%; CO: 3%; $N_2$: 5%; $H_2$: Remainder | 133 | 950 |
| 7 | $Al_2O_{13}$ | $AlCl_4$: 2%; $CO_2$: 5%; $H_2$: Remainder | 67 | 1,050 |
| 8 | $ZrO_2$ | $ZrCl_4$: 2%; $CO_2$: 4%; $H_2$: Remainder | 200 | 1,100 |
| 9 | $\alpha Al_2O_{13}$ | $AlCl_4$: 1%; $H_2S$: 0.3%; $CO_2$: 3.5%; $H_2$: Remainder | 67–200 | 1,050–1,150 |

Figure 1:
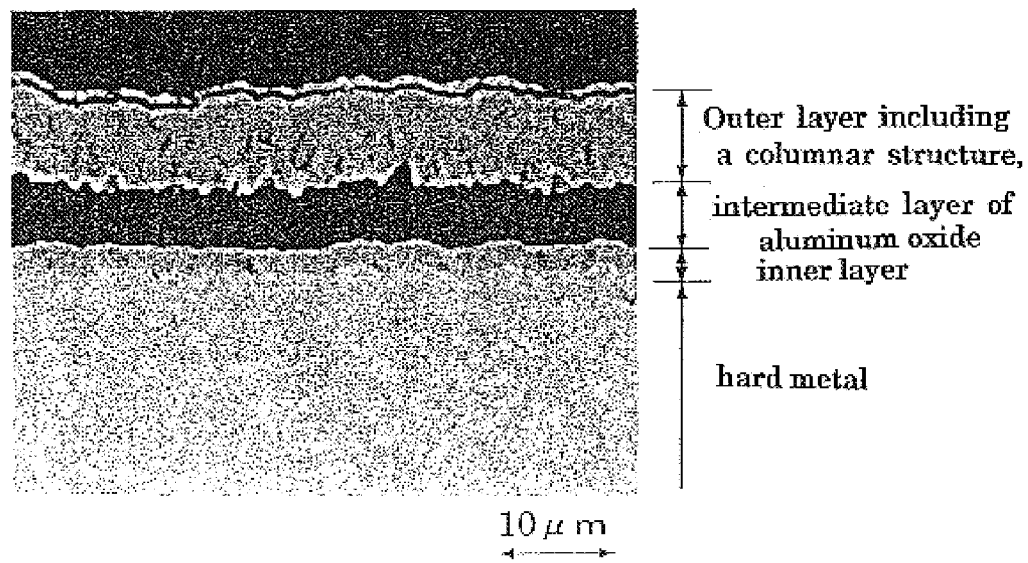
FIG. 1 is a micrograph showing a polished cross section of the coated hard metal of the present invention.

Table II shows the constitutions and the thicknesses of the inner layers of the various samples. Table III shows the constitutions, the thicknesses, and the α-type aluminum oxide's oriented texture coefficients of the intermediate layers. Table IV shows the constitutions, the thicknesses, and the titanium carbonitride's oriented texture coefficients of the outer layers. In the column under "composition and average layer thickness" in Tables II to IV, the layer on the left side lies at the base-material side; the layer on the right side lies at the surface side. Table V shows the tool samples prepared by continuously laminating the inner layer, intermediate layer, and outer layer, each having various types of constitutions. A photograph of an example of a cross section is shown in FIG. 1. FIG. 1 is a micrograph of a cross section of Tool No. 10 in Table V. Table VI shows the tool samples decreased in surface roughness by mechanically polishing the surface of some of the coated hard metal samples of the present invention listed in Table V. The types of methods of the polishing process include barrel finishing, buffing, polishing using an elastic grinding stone, brush honing, and lapping using diamond abrasive grains.

The oxide layer (the aluminum oxide layer) in the intermediate layer of the present invention was formed by using aluminum chloride and carbon dioxide as the principal material gases and by processing them at 1,050° C. Thus, the oriented texture coefficient and the grain size of the aluminum oxide layer were controlled.

The layer of titanium carbonitride having a columnar structure in the outer layer was formed by using an organic CN compound, such as acetonitrile, tolunitrile, acrylonitrile, and butylnitrile, and titanium tetrachloride as the principal reaction gases and by processing them at 890° C. Thus, titanium carbonitride layers having columnar structures, different oriented texture coefficients, and decreased surface roughness were formed.

TABLE II

| | | Total |
| | | thickness |
| Sample | Composition and average layer thickness | of layers |
| No. | (Layer thickness of each composition: μm) | (μm) |
| --- | --- | --- |
| I | TiN (1) | 1.0 |
| II | TiN (2)/TiCN having columnar structure (3)/TiCNO (1) | 6.0 |
| III | TiN (1)/TiCN having columnar structure (2)/TiCNO (1) | 4.0 |
| IV | TiN (1)/TiCN (5)/TiCO (1) | 8.0 |

TABLE III

Constitution of intermediate layer

| | | | Total | Oriented |||
| | | Composition and average | thick- | texture coefficient |||
| | Sample | layer thickness | ness of | of α-type Al$_2$O$_3$ |||
| | name | (Layer thickness of each layer: μm) | layers (μm) | (012) | (104) | (116) |
| --- | --- | --- | --- | --- | --- | --- |
| ※1 | A | α-type Al$_2$O$_3$ (2) | 2.0 | 1.5 | 0.8 | 1.0 |
| | B | α-type Al$_2$O$_3$ (5) | 5.0 | 1.2 | 2.0 | 1.8 |
| | C | α-type Al$_2$O$_3$ (3)/ZrO$_2$ (10) | 13.0 | 1.8 | 0.9 | 1.5 |
| | D | Al$_2$O$_3$ (10) | 10.0 | — | — | — |
| | E | ZrO$_2$ (18) | 18.0 | — | — | — |
| ※2 | F | α-type Al$_2$O$_3$ (8) | 8.0 | 0.9 | 0.7 | 1.2 |
| | G | α-type Al$_2$O$_3$ (25) | 25.0 | 1.4 | 0.8 | 1.4 |
| | H | ZrO$_2$ (1) | 1.0 | — | — | — |

※1: Layer constitution used in the samples of the present invention (Samples A to E).
※2: Layer constitution used in the comparative samples (Samples F to H).

TABLE IV

Constitution of outer layer

| | | | | Oriented texture coefficient ||||
| | | | Total thickness | in specified plane of TiCN ||||
| | Sample | Composition and average layer thickness | of layers | having columnar structure ||||
| | No. | (Layer thickness of each composition: μm) | (μm) | (220) | (311) | (331) | (422) |
| --- | --- | --- | --- | --- | --- | --- | --- |
| ※1 | ① | TiBN(1)/TiCN having columnar structure (2) | 3.0 | 2.8 | 0.7 | 2.0 | 0.6 |
| | ② | TiC(2)/TiCN having columnar structure (5)/TiN (1) | 8.0 | 0.5 | 2.8 | 1.1 | 2.3 |
| | ③ | TiN(2)/TiCN having columnar strcture (8)/TiBN (2)/Al$_2$O$_3$(1)/TiN (1) | 14.0 | 2.8 | 0.7 | 2.0 | 0.6 |
| | ④ | TiC (2)/TiCN having columnar structure (18) | 20.0 | 1.6 | 1.4 | 1.3 | 0.8 |
| ※2 | ⑤ | TiN (1) | 1.0 | — | — | — | — |
| | ⑥ | TiC (2)/TiCN having columnar structure (5)/TiN (1) | 8.0 | 0.4 | 1.2 | 1.1 | 1.2 |
| | ⑦ | TiCN (5)/TiN (2) | 7.0 | — | — | — | — |

※1: Layer constitution used in the samples of the present invention (Samples ① to ④)
※1: Layer constitution used in the comparative samples (Samples ⑤ to ⑦)

TABLE V

| | | Constitution of coating | | | | | | | | |
|---|---|---|---|---|---|---|---|---|---|---|
| | | Inner layer | Intermediate layer | | Outer layer | | | | | |
| | Tool No. | Constitution shown in Table II | Constitution shown in Table III | Roughness Amax (μm) | Constitution shown in Table IV | Roughness Bmax (μm) | Bmax/Amax | Width of flank wear (mm) | State of crater wear, including state of welding | Operating lifetime (min) |
| Sample of present invention | 1 | I | A | 1.4 | ① | 1.3 | 0.93 | 0.20 | Slight damage | 60 |
| | 2 | I | B | 2.1 | ① | 1.9 | 0.90 | 0.19 | Slight damage | 78 |
| | 3 | I | C | 4.0 | ① | 3.5 | 0.88 | 0.21 | Slight damage | 59 |
| | 4 | I | D | 1.9 | ① | 1.7 | 0.89 | 0.22 | Slight damage | 68 |
| | 5 | II | A | 1.4 | ② | 1.0 | 0.71 | 0.18 | Slight damage | 74 |
| | 6 | II | B | 2.1 | ② | 1.5 | 0.71 | 0.16 | Slight damage | 69 |
| | 7 | II | C | 4.0 | ② | 2.8 | 0.70 | 0.17 | No damage | 55 |
| | 8 | II | E | 2.0 | ② | 1.4 | 0.70 | 0.18 | No damage | 54 |
| | 9 | III | A | 1.4 | ③ | 1.3 | 0.93 | 0.17 | Slight damage | 95 |
| | 10 | III | B | 2.1 | ③ | 2.0 | 0.95 | 0.14 | Slight damage | 92 |
| | 11 | III | C | 4.0 | ③ | 3.6 | 0.90 | 0.15 | Slight damage | 70 |
| | 12 | III | D | 1.9 | ③ | 1.7 | 0.89 | 0.16 | Slight damage | 90 |
| | 13 | IV | A | 1.4 | ④ | 0.5 | 0.36 | 0.20 | No damage | 87 |
| | 14 | IV | B | 2.1 | ④ | 0.7 | 0.33 | 0.14 | No damage | 95 |
| | 15 | IV | C | 4.0 | ④ | 1.4 | 0.35 | 0.16 | No damage | 90 |
| | 16 | IV | E | 2.0 | ④ | 0.7 | 0.35 | 0.17 | No damage | 89 |
| Comparative sample | 17 | I | F | 1.0 | ⑤ | 1.5 | 1.50 | 0.37 | Severe damage | 15 |
| | 18 | II | G | 1.2 | ⑤ | 1.3 | 1.08 | 0.34 | Severe damage | 18 |
| | 19 | III | G | 1.2 | ⑥ | 1.4 | 1.17 | 0.29 | Severe damage | 17 |
| | 20 | IV | H | 1.2 | ⑦ | 1.1 | 1.22 | 0.33 | Severe damage | 10 |

TABLE VI

| | | Constitution of coating | | | | | Polishing of outermost surface | | Width of coating | | |
|---|---|---|---|---|---|---|---|---|---|---|---|
| | | Inner layer | Intermediate layer | | Outer layer | | | | | | |
| | Tool No. | Constitution shown in Table II | Constitution shown in Table III | Roughness Amax (μm) | Constitution shown in Table IV | Roughness Bmax (μm) | Roughness Cmax (μm) | Cmax/Amax | flank wear (mm) | State of crater wear, including state of welding | Operating lifetime (min) |
| Sample of present invention | 9' | III | A | 1.4 | ③ | 1.3 | 0.60 | 0.43 | 0.15 | Slight damage | 99 |
| | 10' | III | B | 2.1 | ③ | 2.0 | 0.11 | 0.05 | 0.11 | No damage | 105 |
| | 11' | III | C | 4.0 | ③ | 3.6 | 0.50 | 0.13 | 0.12 | Slight damage | 76 |
| | 12' | III | D | 1.9 | ③ | 1.7 | 0.12 | 0.06 | 0.13 | No damage | 92 |
| | 13' | IV | A | 1.4 | ④ | 0.5 | 0.45 | 0.32 | 0.17 | No damage | 89 |
| | 14' | IV | B | 2.1 | ④ | 0.7 | 0.10 | 0.05 | 0.09 | No damage | 115 |
| | 15' | IV | C | 4.0 | ④ | 1.4 | 0.05 | 0.01 | 0.10 | No damage | 110 |
| | 16' | IV | E | 2.0 | ④ | 0.7 | 0.08 | 0.04 | 0.11 | No damage | 109 |
| Comparative sample | 17' | I | F | 1.0 | ⑤ | 1.5 | — | — | 0.37 | Severe damage | 15 |
| | 18' | II | G | 1.2 | ⑤ | 1.3 | — | — | 0.34 | Severe damage | 18 |
| | 19' | III | G | 1.2 | ⑥ | 1.4 | — | — | 0.29 | Severe damage | 17 |
| | 20' | IV | H | 1.2 | ⑦ | 1.1 | — | — | 0.33 | Severe damage | 10 |

The above-described samples were subjected to performance evaluations under the following cutting conditions:

Workpiece: An SCM415 round bar with grooves

Cutting speed: 400 m/min.

Feed: 0.30 mm/rev.

Depth of cut: 1.5 mm

Cutting oil: Not used

The evaluation results are shown in Tables V and VI. Under the column "state of crater wear" in these tables the degree of welding and the state of damage on the "face" of the tool are shown.

The results demonstrate that the samples of the present invention have superior resistance to wear and to welding (crater wear), have increased resistance to chipping and to flaking, and hence have a protracted lifetime as a tool, in comparison with the comparative samples.

INDUSTRIAL APPLICABILITY

As described above, when the coated hard metal of the present invention is used for a cutting tool, the tool exhibits excellent resistance to wear, to chipping, to welding, and to flaking, proving that the tool is suitable for high-efficiency work and dry processing. As a result, the lifetime of the tool can be lengthened dramatically without variations.

What is claimed is:

1. A hard metal provided with a coating on a surface of said hard metal, in which the hard metal has a coating comprising an inner layer, an intermediate layer, and an outer layer in that order from the hard-metal side;

said inner layer comprising a layer composed of at least one member selected from the group consisting of the carbides, nitrides, borides, and oxides of the elements belonging to the IVa, Va, and VIa groups in the periodic table and solid solutions thereof;

said intermediate layer comprising a layer composed of at least one member selected from the group consisting of aluminum oxide, zirconium oxide, and solid solutions thereof; and said outer layer comprising a layer of titanium carbonitride having a columnar structure, wherein in a cross section showing the structure of the coated hard metal, the relation between "Amax," which signifies the maximum roughness at the outer face of the intermediate layer, and "Bmax," which signifies the maximum roughness at the outer face of the layer of titanium carbonitride having a columnar structure in the outer layer, satisfies equation 1, equation 1 being:

(Bmax/Amax)<1      equation 1, where 0.5, $\mu$m<Amax<4.5 $\mu$m, and 0.5 $\mu$m $\leq$=Bmax$\leq$4.5 $\mu$m.

2. The coated hard metal as defined in claim 1, wherein, in a cross section showing the structure of the coated hard metal, the relation between "Amax," which signifies the maximum roughness at the outer face of the intermediate layer, and "Bmax," which signifies the maximum roughness at the outer face of the layer of titanium carbonitride having a columnar structure in the outer layer, satisfies equation 2, equation 2 being:

(Bmax/Amax)<0.8      equation 2.

3. The coated hard metal as defined in claim 1, wherein:
(a) the inner layer has a thickness of 0.1 to 10 $\mu$m;
(b) the intermediate layer has a thickness of 1.5 to 20 $\mu$m; and
(c) the outer layer has a thickness of 2 to 30, $\mu$m.

4. The coated hard metal as defined in claim 1, wherein:
(a) the layer of titanium carbonitride having a columnar structure in the outer layer has the largest value in the oriented texture coefficient TC, defined in equation 3, at any one of the (220), (311), (331), and (422) planes; and
(b) the largest value is not less than 1.3 and not more than 3.5; equation 3 being:

$$TC(hkl) = \frac{I(hkl)}{Io(hkl)} \left\{ \frac{1}{8} \sum_{x,y,z} \frac{I(h_x k_y l_z)}{Io(h_x k_y l_z)} \right\}^{-1} \quad \text{equation 3}$$

where I(hkl) and I($h_x k_y l_z$) the measured diffraction intensity at the (hkl) and ($h_x k_y l_z$) planes, respectively,
$I_o$(hkl) and $I_o$($h_x k_y l_z$): the average value of the powder diffraction intensities of TiC and TiN at the (hkl) and ($h_x k_y l_z$) planes, respectively, in accordance with the ASTM Standard, and
(hkl) and ($h_x k_y l_z$): eight planes of (111), (200), (220), (311), (331), (420), (422), and (511), respectively.

5. The coated hard metal as defined in claim 1, wherein the oriented texture coefficients TCs at the (311) and (422) planes of the layer of titanium carbonitride having a columnar structure in the outer layer are concurrently not less than 1.3 and not more than 3.5.

6. The coated hard metal as defined in claim 1, wherein the intermediate layer is composed practically of $\alpha$-type aluminum oxide.

7. The coated hard metal as defined in claim 1, wherein:
(a) the intermediate layer has cracks in a direction perpendicular to the layer; and
(b) a compound in the outer layer penetrates into the cracks.

8. The coated hard metal as defined in claim 6, wherein the $\alpha$-type aluminum oxide has an oriented texture coefficient, TCa, defined in equation 4, of more than 1.3 at the (012) plane; equation 4 being:

$$TCa(hkl) = \left\{ \frac{1}{6} \sum_{x,y,z} \frac{I(k_x k_y l_z)}{Io(h_x k_y l_z)} \right\}^{-1} \quad \text{equation 4}$$

where I(hkl) and I($h_x k_y l_z$): the measured diffraction intensity at the (hkl) and ($h_x k_y l_z$) planes, respectively,
$I_o$(hkl) and $I_o$($h_x k_y l_z$): the powder diffraction intensity of the $\alpha$-type crystal-structure alumna at the (hkl) and I($h_x k_y l_z$) planes, respectively, in accordance with the ASTM Standard, and
(hkl) and ($h_x k_y l_z$) six planes of (012), (104), (110), (113), (024), and (116), respectively.

9. The coated hard metal as defined in claim 8, wherein the oriented texture coefficient TCa exceeds 1.3 at the (104) and (116) planes.

10. The coated hard metal as defined in claim 1, wherein the hard metal is a cemented carbide comprising:
(a) a hard phase comprising:
(a1) tungsten carbide as the main constituent; and
(a2) at least one member selected from the group consisting of:
(a2a) the carbides, nitrides, and carbonitrides of the metals belonging to the IVa, Va, and VIa groups in the periodic table; and
(a2b) the solid solutions of these except tungsten carbide; and
(b) a binder phase comprising at least one member selected from Fe, Co, or Ni.

11. The coated hard metal as defined in claim 1, wherein the surface roughness "Cmax" at the outermost surface of the coating satisfies equation 5, equation 5 being:

Cmax/Bmax<0.5      equation 5.

* * * * *